United States Patent
Byun

(10) Patent No.: US 9,824,763 B2
(45) Date of Patent: Nov. 21, 2017

(54) MEMORY SYSTEM AND OPERATING METHOD THEREOF

(71) Applicant: SK hynix Inc., Gyeonggi-do (KR)

(72) Inventor: Eu-Joon Byun, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 15/406,188

(22) Filed: Jan. 13, 2017

(65) Prior Publication Data
US 2017/0301400 A1    Oct. 19, 2017

(30) Foreign Application Priority Data
Apr. 14, 2016    (KR) .................... 10-2016-0045584

(51) Int. Cl.
G11C 16/06    (2006.01)
G11C 16/10    (2006.01)
G11C 16/30    (2006.01)

(52) U.S. Cl.
CPC ............ G11C 16/10 (2013.01); G11C 16/30 (2013.01)

(58) Field of Classification Search
CPC .. G06F 12/0246; G06F 3/0679; G06F 3/0688; G06F 11/1032; G06F 11/1438; G06F 11/1469; G06F 12/0238; G06F 13/00; G06F 1/3203; G06F 1/3234; G06F 1/3275; G06F 1/3287; G06F 9/4401; G06F 9/4406
See application file for complete search history.

(56) References Cited

U.S. PATENT DOCUMENTS

| 7,990,765 | B2 | 8/2011 | Park et al. |
| 8,873,328 | B2 | 10/2014 | Shin et al. |
| 2015/0261617 | A1* | 9/2015 | Choi .................. G11C 11/5642 714/6.22 |

FOREIGN PATENT DOCUMENTS

KR    101342658    12/2013

* cited by examiner

*Primary Examiner* — Thong Q Le
(74) *Attorney, Agent, or Firm* — IP & T Group LLP

(57) ABSTRACT

A memory system includes: a memory device comprising a plurality of memory dies, each memory die including a plurality of planes, each plane including a plurality of memory blocks, each memory block including a plurality of pages, each page including a plurality of memory cells in which data is stored; and a controller suitable for, after a first time when the memory system in a power-on state performs a program operation corresponding to a write command received from a host, on first pages of the memory blocks, and records program information on the program operation in a list, in the case where power off occurs at a second time while the memory system performs a program operation on second pages of the memory blocks, checking the program information recorded in the list after the memory system is changed from a power-off state to the power-on state at a third time, and performing a recovery operation for the memory blocks for which a program operation was not completed due do the power off.

20 Claims, 11 Drawing Sheets

MEMORY SYSTEM AND OPERATING METHOD THEREOF

CROSS-REFERENCE TO RELATED APPLICATION

This application claims priority under 35 U.S.C. §119(a) to Korean Patent Application No. 10-2016-0045584 filed on Apr. 14, 2016 in the Korean Intellectual Property Office, the disclosure of which is incorporated herein by reference in its entirety.

TECHNICAL FIELD

Exemplary embodiments relate to a memory system and, more particularly, to a memory system that processes data to a memory device and an operating method thereof.

DISCUSSION OF THE RELATED ART

The computer environment paradigm has shifted to ubiquitous computing systems that can be used anytime and anywhere. Due to this fact, use of portable electronic devices such as mobile phones, digital cameras, and notebook computers has rapidly increased. These portable electronic devices generally use as data storage devices for storing data, a memory system having one or more memory devices. The memory system may be used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces, and solid state drives (SSD).

Consumer demand for faster, more capable and more reliable electronic devices requires improved memory systems.

SUMMARY

Various embodiments of the present invention are directed to a memory system capable of reducing complexity and performance deterioration thereof, and improving use efficiency of a memory device, thereby more rapidly processing data, and an operating method thereof.

In an embodiment, a memory system may include a memory device comprising a plurality of memory dies, each memory die including a plurality of planes, each plane including a plurality of memory blocks each memory block including a plurality of pages, each page including a plurality of memory cells in which data is stored; and a controller suitable for, after a first time when the memory system in a power-on state performs a program operation corresponding to a write command received from a host, on first pages of the memory blocks, and records program information on the program operation in a list, in the case where power off occurs at a second time while the memory system performs a program operation on second pages of the memory blocks, checking the program information recorded in the list after the memory system is changed from a power-off state to the power-on state at a third time, and performing a recovery operation for the memory blocks for which a program operation was not completed due do the power off.

The list may include rows corresponding to the respective memory blocks, and bit regions in the rows, corresponding to the respective pages of the memory blocks.

The controller may record program information on the first pages in a first bit region corresponding to the first pages, in a first row of the list corresponding to a first memory block.

The controller may record program start information and program end information on the first pages in the list in the form of a bit map.

The controller may store data corresponding to the write command in pages of a super memory block including the memory blocks, through a one-shot program.

The super memory block may include a first memory block and a second memory block of the memory blocks, and the first memory block may be an arbitrary memory block among memory blocks included in a first plane of a first memory die among the memory dies.

The second memory block may be a memory block different from the arbitrary memory block among the memory blocks included in the first plane of the first memory die among the memory dies.

The second memory block may be an arbitrary memory block among memory blocks included in a second plane of the first memory die among the memory dies.

The second memory block may be an arbitrary memory block among memory blocks included in a plurality of planes of a second memory die among the memory dies.

The list may include a row corresponding to the super memory block, and bit regions in the row, corresponding to respective pages of the super memory block.

In an embodiment, an operating method of a memory system may include: performing, in a plurality of pages which are respectively included in a plurality of memory blocks of a memory device and include a plurality of memory cells, a program operation corresponding to a write command received from a host, on first pages of the memory blocks, at a first time when the memory system is in a power-on state; recording program information on the program operation in a list; changing a state of the memory system from the power-on state to a power-off state, at a second time when power off occurs while performing a program operation on second pages of the memory blocks; and checking the program information recorded in the list after the memory system is changed from the power-off state to the power-on state at a third time, and performing a recovery operation for the memory blocks for which a program operation was not completed due do the power off.

The list may include rows corresponding to the respective memory blocks, and bit regions in the rows, corresponding to the respective pages of the memory blocks.

The recording of the program information on the program operation may include: recording program information on the first pages in a first bit region corresponding to the first pages, in a first row of the list corresponding to a first memory block.

The recording of the program information on the first pages in the first bit region may include: recording program start information and program end information on the first pages in the list in the form of a bit map.

The performing of the program operation may include: storing data corresponding to the write command in pages of a super memory block including the memory blocks, through a one-shot program.

The super memory block may include a first memory block and a second memory block of the memory blocks, and the first memory block may be an arbitrary memory block among memory blocks included in a first plane of a first memory die among the memory dies.

The second memory block may be a memory block different from the arbitrary memory block among the memory blocks included in the first plane of the first memory die among the memory dies.

The second memory block may be an arbitrary memory block among memory blocks included in a second plane of the first memory die among the memory dies.

The second memory block may be an arbitrary memory block among memory blocks included in a plurality of planes of a second memory die among the memory dies.

The list may include a row corresponding to the super memory block, and bit regions in the row, corresponding to respective pages of the super memory block.

BRIEF DESCRIPTION OF THE DRAWINGS

The above and other features and advantages of the present invention will become more apparent to those skilled in the art to which the present invention belongs by describing in detail various embodiments thereof with reference to the attached drawings.

DETAILED DESCRIPTION

Figure 1:
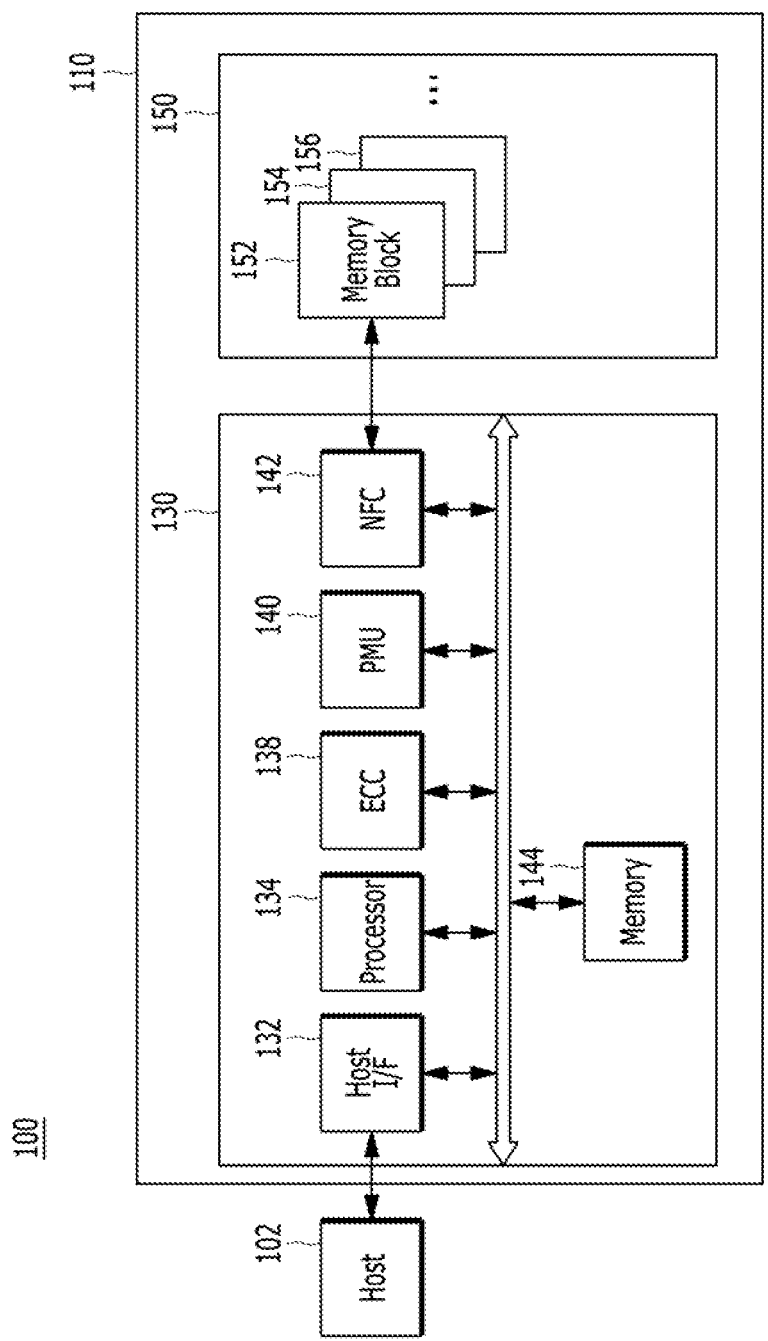
FIG. 1 is a diagram illustrating a data processing system including a memory system, according to an embodiment of the present invention.

Although, various embodiments are described below in more detail with reference to the accompanying drawings, we note that the present invention may, however, be embodied in different forms and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

FIG. 1 illustrates a data processing system including a memory system, according to an embodiment of the present invention.

Referring to FIG. 1, a data processing system 100 may include a host 102 and a memory system 110.

The host 102 may include, for example, a portable electronic device such as a mobile phone, an MP3 player and a laptop computer or an electronic device such as a desktop computer, a game player, a TV and a projector.

The memory system 110 may operate in response to a request from the host 102. For example, the memory system 110 may store data to be accessed by the host 102. The memory system 110 may be used as a main memory system or an auxiliary memory system of the host 102. The memory system 110 may be implemented with any one of various storage devices, according to the protocol of a host interface to be coupled electrically with the host 102. The memory system 110 may be implemented with any one of various storage devices, such as, for example, a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device, such as, a dynamic random access memory (DRAM) and a static random access memory (SRAM) or a nonvolatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM) a magnetoresistive RAM (MRAM) and a resistive RAM (RRAM).

The memory system 110 may include a memory device 150 which stores data to be accessed by the host 102, and a controller 130 which may control storage of data in the memory device 150.

The controller 130 and the memory device 150 may be integrated into one semiconductor device. For instance, the controller 130 and the memory device 150 may be integrated into one semiconductor device configured as a solid state drive (SSD). When the memory system 110 is used as the SSD, the operation speed of the host 102 that is electrically coupled with the memory system 110 may be significantly increased.

The controller 130 and the memory device 150 may be integrated into one semiconductor device configured as a memory card, for example, a Personal Computer Memory Card International Association (PCMCIA) card, a compact flash (CF) card, a smart media (SM) card (SMC), a memory stick, a multimedia card (MMC), an RS-MMC and a micro-MMC, a secure digital (SD) card, a mini-SD, a micro-SD and an SDHC, and a universal flash storage (UFS) device.

For another instance, the memory system 110 may configure a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, or one of various component elements configuring a computing system.

The memory device 150 of the memory system 110 may retain stored data when power supply to the device is interrupted and, in particular, store the data provided from the host 102 during a write operation, and provide stored data to the host 102 during a read operation. The memory device 150 may include a plurality of memory blocks 152, 154 and 156. Each of the memory blocks 152, 154 and 156 may include a plurality of pages. Each of the pages may include a plurality of memory cells to which a plurality of word lines (WL) are electrically coupled. The memory device 150 may be a nonvolatile memory device, for example, a flash memory. The flash memory may have a three-dimensional (3D) stack structure. The structure of the memory device 150 and the three-dimensional (3D) stack structure of the memory device 150 will be described later in detail with reference to FIGS. 2 to 11.

The controller 130 of the memory system 110 may control the memory device 150 in response to a request from the host 102. The controller 130 may provide the data read from the memory device 150, to the host 102, and store the data provided from the host 102 into the memory device 150. To this end, the controller 130 may control overall operations of the memory device 150, such as read, write, program and erase operations.

For example, the controller 130 may include a host interface unit 132, a processor 134, an error correction code (ECC) unit 138, a power management unit 140, a NAND flash controller 142, and a memory 144.

The host interface unit 132 may process commands and data provided from the host 102, and may communicate with the host 102 through at least one of various interface protocols such as universal serial bus (USB), multimedia card (MMC), peripheral component interconnect-express (PCI-E), serial attached SCSI (SAS), serial advanced technology attachment (SATA), parallel advanced technology attachment (PATA), small computer system interface (SCSI), enhanced small disk interface (ESDI), and integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The PMU 140 may provide and manage power for the controller 130, that is, power for the component elements included in the controller 130.

The NFC 142 may serve as a memory interface between the controller 130 and the memory device 150 to allow the controller 130 to control the memory device 150 in response to a request from the host 102. The NEC 142 may generate control signals for the memory device 150 and process data under the control of the processor 134 when the memory device 150 is a flash memory and, in particular, when the memory device 150 is a NAND flash memory.

The memory 144 may serve as a working memory of the memory system 110 and the controller 130, and store data for driving the memory system 110 and the controller 130. The controller 130 may control the memory device 150 in response to a request from the host 102. For example, tie controller 130 may provide the data read from the memory device 150 to the host 102 and store the data provided from the host 102 in the memory device 150. When the controller 130 controls the operations of the memory device 150, the memory 144 may store data used by the controller 130 and the memory device 150 for such operations as read, write, program and erase operations.

The memory 144 may be implemented with volatile memory. The memory 144 may be implemented with a static random access memory (SRAM) or a dynamic random access memory (DRAM). As described above, the memory 144 may store data used by the host 102 and the memory device 150 for the read and write operations. To store the data, the memory 144 may include a program memory, a data memory, a write buffer, a read buffer, a map buffer, and so forth.

The processor 134 may control general operations of the memory system 110, and a write operation or a read operation for the memory device 150, in response to a write request or a read request from the host 102. The processor 134 may drive firmware, which is referred to as a flash translation layer (FTL) to control the general operations of the memory system 110. The processor 134 may be implemented with a microprocessor or a central processing unit (CPU).

A management unit (not shown) may be included in the processor 134, and may perform bad block management of the memory device 150. The management unit may find bad memory blocks included in the memory device 150, which are in unsatisfactory condition for further use, and perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. Also, the bad blocks due to the program fail seriously deteriorates the utilization efficiency of the memory device 150 having a 3D stack structure and the reliability of the memory system 100, and thus reliable bad block management is required.

Figure 2:
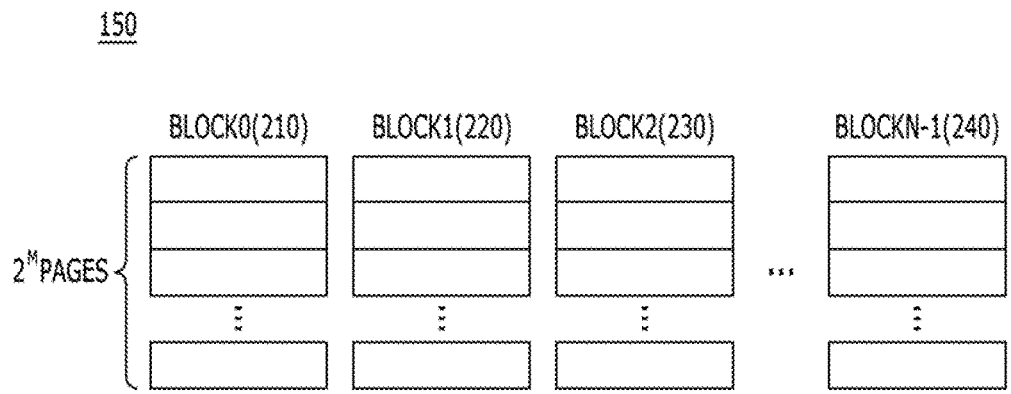
FIG. 2 is a diagram illustrating an example of a memory device employed in the memory system of FIG. 1.

FIG. 2 is a schematic diagram illustrating the memory device 150 of FIG. 1.

Referring to FIG. 2, the memory device 150 may include a plurality of memory blocks, for example, zeroth to $(N-1)^{th}$ blocks 210 to 240. Each of the plurality of memory blocks 210 to 240 may include a plurality of pages, for example, $2^M$ number of pages ($2^M$ PAGES), to which the present invention will not be limited. Each of the plurality of pages may include a plurality of memory cells to which a plurality of word lines are electrically coupled.

Also, the memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. An MLC memory block including a plurality of pages which are implemented with memory cells that are each capable of storing 3-bit data may be defined as a triple level cell (TLC) memory block.

Each of the plurality of memory blocks 210 to 240 may store the data provided from the host device 102 during a write operation, and may provide stored data to the host 102 during a read operation.

Figure 3:
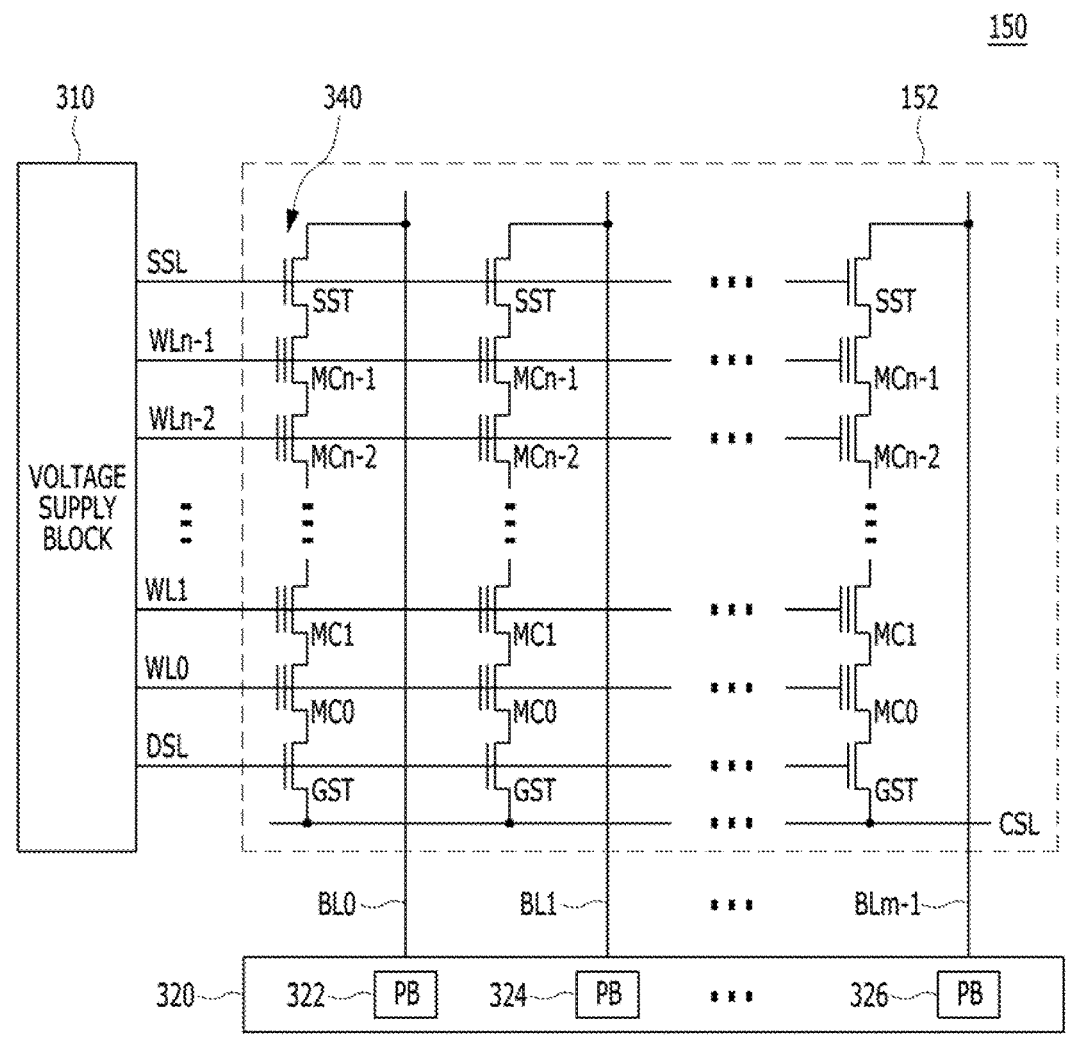
FIG. 3 is a circuit diagram illustrating a memory block in a memory device, according to an embodiment of the present invention.

FIG. 3 is a circuit diagram illustrating one of the plurality of memory blocks 152 to 156 of FIG. 1.

Referring to FIG. 3, the memory block 152 of the memory device 150 may include a plurality of cell strings 340 which are electrically coupled to bit lines BL0 to BLm-1, respectively. The cell string 340 of each column may include at least one drain select transistor DST and at least one source select transistor SST. A plurality of memory cells or a plurality of memory cell transistors MC0 to Mn-1 may be electrically coupled in series between the select transistors DST and SST. The respective memory cells MC0 to MCn-1 may be configured by multi-level cells (MLC) each of which stores data information of a plurality of bits. The strings 340 may be electrically coupled to the corresponding bit lines BL0 to BLm-1, respectively. For reference in FIG. 3, 'DSL' denotes a drain select line, 'SSL' denotes a source select line, and 'CSL' denotes a common source line.

While FIG. 3 shows, as an example, the memory block 152 which is configured by NAND flash memory cells, it is to be noted that the memory block 152 of the memory device 150 in accordance with the embodiment is not limited to NAND flash memory and may be realized by NOR flash memory, hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A voltage supply block 310 of the memory device 150 may provide word line voltages, for example, a program voltage, a read voltage and a pass voltage, to be supplied to respective word lines according to an operation mode and voltages to be supplied to bulks, for example, well regions in which the memory cells are formed. The voltage supply block 310 may perform a voltage generating operation under the control of a control circuit (not shown). The voltage supply block 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read/write circuit 320 of the memory device 150 may be controlled by the control circuit, and may serve as a sense amplifier or a write driver according to an operation mode. During a verification/normal read operation, the read/write circuit 320 may serve as a sense amplifier for reading data from the memory cell array. Also, during a program operation, the read/write circuit 320 may serve as a write driver which drives bit lines according to data to be stored in the memory cell array. The read/write circuit 320 may receive data to be written in the memory cell array, from a buffer (not shown), during the program operation, and may drive the bit lines according to the inputted data. To this end, the read/write circuit 320 may include a plurality of page buffers 322, 324 and 326 respectively corresponding to columns (or bit lines) or pairs of columns (or pairs of bit lines), and a plurality of latches (not shown) may be included in each of the page buffers 322, 324 and 326.

FIGS. 4 to 11 are schematic diagrams illustrating the memory device 150 of FIG. 1.

Figure 4:
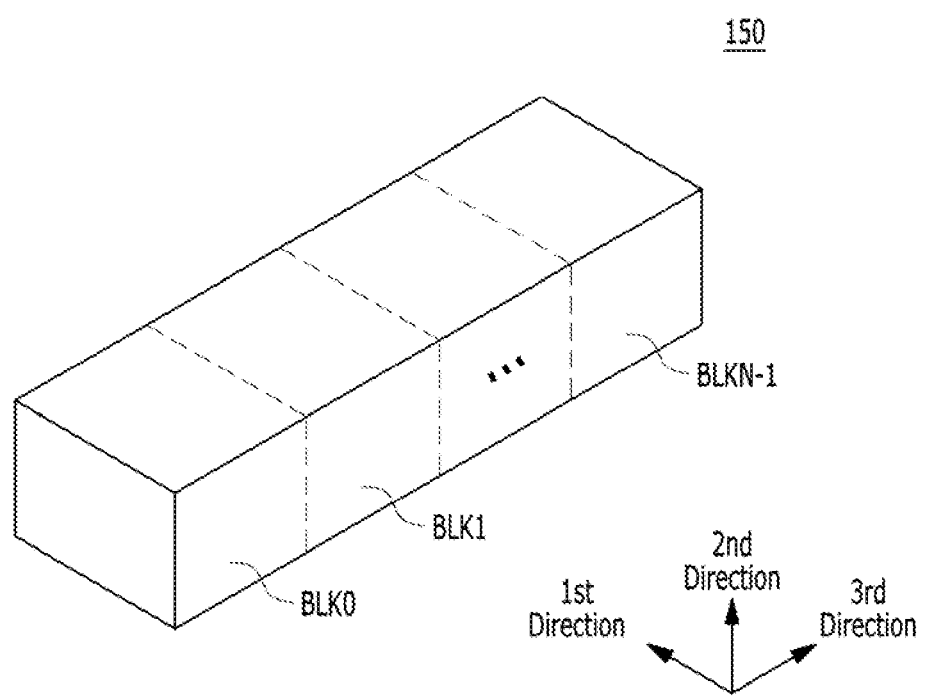
FIGS. 4 to 11 are diagrams schematically illustrating various aspects of the memory device of FIG. 2.

FIG. 4 is a block diagram illustrating an example of the plurality of memory blocks 152 to 156 of the memory device 150 of FIG. 1.

Referring to FIG. 4, the memory device 150 may include a plurality of memory blocks BLK0 to BLKN-1, and each of the memory blocks BLK0 to BLKN-1 may be realized in a three-dimensional (3D) structure or a vertical structure. The respective memory blocks BLK0 to BLKN-1 may include structures which extend in first to third directions, for example, an x-axis direction, a y-axis direction and a z-axis direction.

The respective memory blocks BLK0 to BLKN-1 may include a plurality of NAND strings NS extending in the second direction. The plurality of NAND strings NS may be provided in the first direction and the third direction. Each NAND string NS may be electrically coupled to a bit line BL, at least one source select line SSL, at least one ground select line GSL, a plurality of word lines WL, at least one dummy word line DWL, and a common source line CSL. Namely, the respective memory blocks BLK0 to BLKN−1 may be electrically coupled to a plurality of bit lines BL, a plurality of source select lines SSL, a plurality of ground select lines GSL, a plurality of word lines WL, a plurality of dummy word lines DWL, and a plurality of common source lines CSL.

Figure 5:
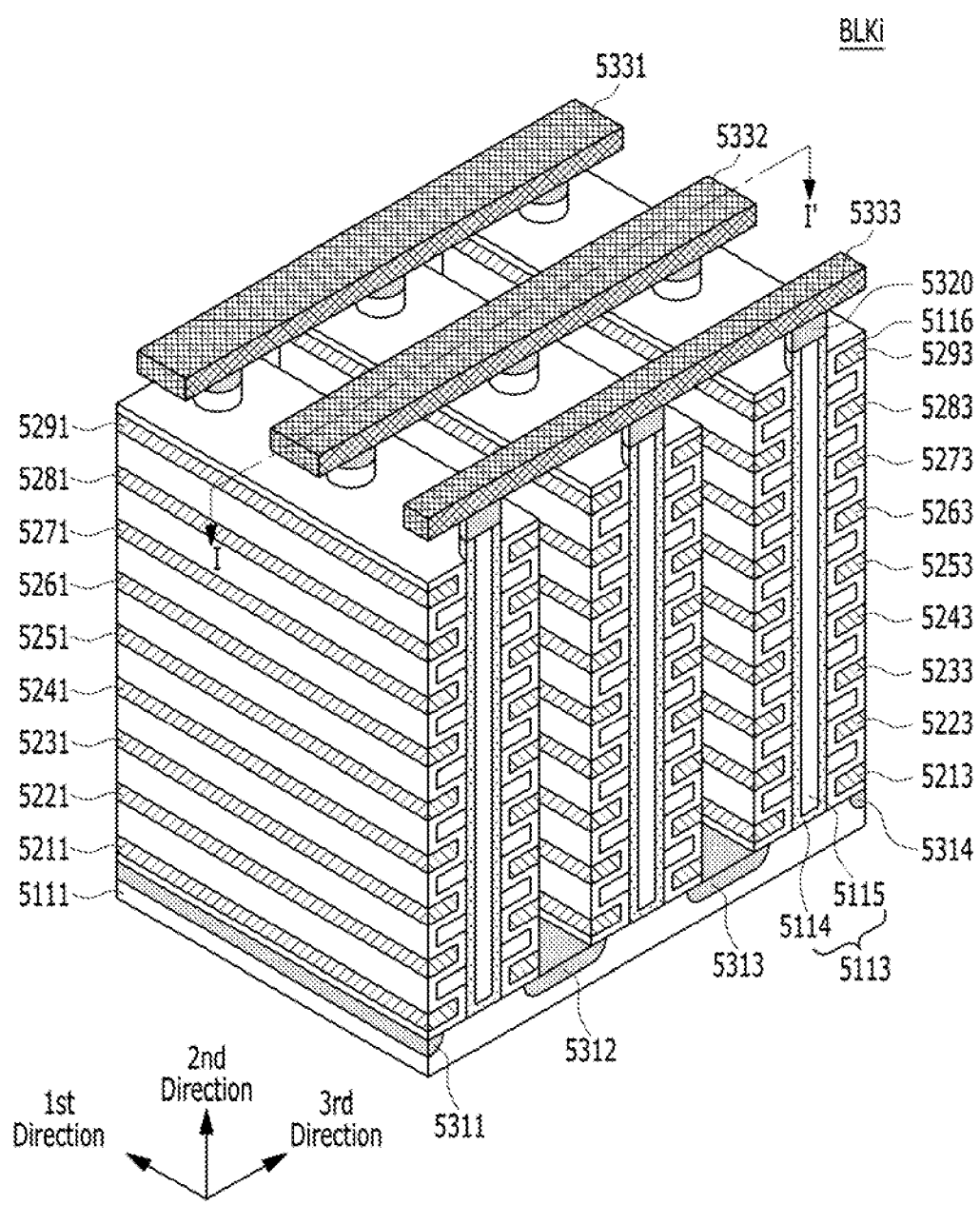
Figure 6:
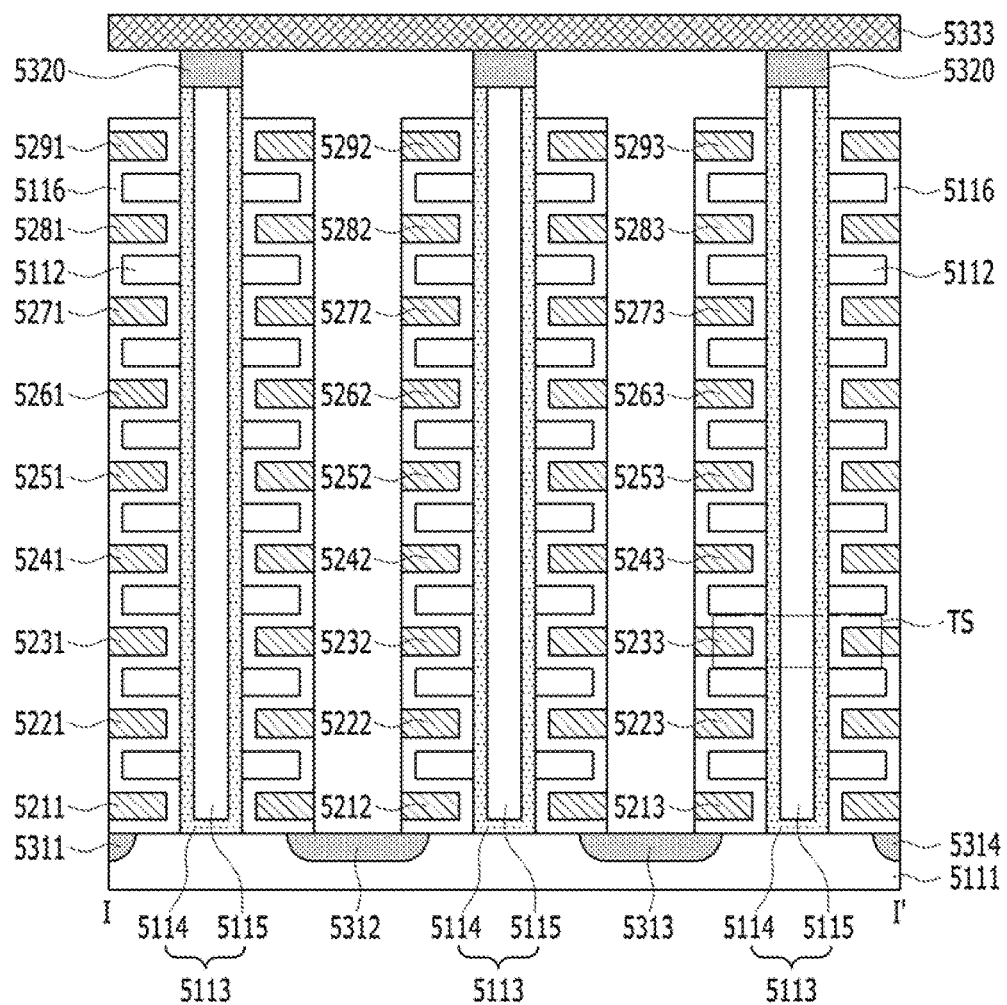

FIG. 5 is a perspective view of one BLKi of the plural memory blocks BLK0 to BLKN−1 of FIG. 4. FIG. 6 is a cross-sectional view taken along a line of the memory block BLKi of FIG. 5.

Referring to FIGS. 5 and 6, a memory block BLKi among the plurality of memory blocks of the memory device 150 may include a structure which extends in the first to third directions.

A substrate 5111 may be provided. The substrate 5111 may include a silicon material doped with a first type impurity. The substrate 5111 may include a silicon material doped with a p-type impurity or may be a p-type well, for example, a pocket p-well, and include an n-type well which surrounds the p-type well. While it is assumed that the substrate 5111 is p-type silicon, it is to be noted that the substrate 5111 is not limited to being p-type silicon.

A plurality of doping regions 5311 to 5314 extending in the first direction may be provided over the substrate 5111. The plurality of doping regions 5311 to 5314 may contain a second type of impurity that is different from the substrate 5111. The plurality of doping regions 5311 to 5314 may be doped with an n-type impurity. While it is assumed here that first to fourth doping regions 5311 to 5314 are n-type, it is to be noted that the first to fourth doping regions 5311 to 5314 are not limited to being n-type.

In the region over the substrate 5111 between the first and second doping regions 5311 and 5312, a plurality of dielectric materials 5112 extending in the first direction may be sequentially provided in the second direction. The dielectric materials 5112 and the substrate 5111 may be separated from one another by a predetermined distance in the second direction. The dielectric materials 5112 may be separated from one another by a predetermined distance in the second direction. The dielectric materials 5112 may include a dielectric material such as silicon oxide.

In the region over the substrate 5111 between the first and second doping regions 5311 and 5312, a plurality of pillars 5113 which are sequentially disposed in the first direction and pass through the dielectric materials 5112 in the second direction may be provided. The plurality of pillars 5113 may respectively pass through the dielectric materials 5112 and may be electrically coupled with the substrate 5111. Each pillar 5113 may be configured by a plurality of materials. The surface layer 5114 of each pillar 5113 may include a silicon material doped with the first type of impurity. The surface layer 5114 of each pillar 5113 may include a silicon material doped with the same type of impurity as the substrate 5111. While it is assumed here that the surface layer 5114 of each pillar 5113 may include p-type silicon, the surface layer 5114 of each pillar 5113 is not limited to being p-type silicon.

An inner layer 5115 of each pillar 5113 may be formed of a dielectric material. The inner layer 5115 of each pillar 5113 may be filled by a dielectric material such as silicon oxide.

In the region between the first and second doping regions 5311 and 5312, a dielectric layer 5116 may be provided along the exposed surfaces of the dielectric materials 5112, the pillars 5113 and the substrate 5111. The thickness of the dielectric layer 5116 may be less than half of the distance between the dielectric materials 5112. In other words, a region in which a material other than the dielectric material 5112 and the dielectric layer 5116 may be disposed, may be provided between (i) the dielectric layer 5116 provided over the bottom surface of a first dielectric material of the dielectric materials 5112 and (ii) the dielectric layer 5116 provided over the top surface of a second dielectric material of the dielectric materials 5112. The dielectric materials 5112 lie below the first dielectric material.

In the region between the first and second doping regions 5311 and 5312, conductive materials 5211 to 5291 may be provided over the exposed surface of the dielectric layer 5116. The conductive material 5211 which extends in the first direction may be provided between the dielectric material 5112 adjacent to the substrate 5111 and the substrate 5111. In particular, the conductive material 5211 which extends in the first direction may be provided between (i) the dielectric layer 5116 disposed over the substrate 5111 and (ii) the dielectric layer 5116 disposed over the bottom surface of the dielectric material 5112 adjacent to the substrate 5111.

The conductive material which extends in the first direction may be provided between (i) the dielectric layer 5116 disposed over the top surface of one of the dielectric materials 5112 and (ii) the dielectric layer 5116 disposed over the bottom surface of another dielectric material of the dielectric materials 5112, which is disposed over the certain dielectric material 5112. The conductive materials 5221 to 5281 extending in the first direction may be provided between the dielectric materials 5112. The conductive material 5291 which extends in the first direction may be provided over the uppermost dielectric material 5112. The conductive materials 5211 to 5291 extending in the first direction may be a metallic material. The conductive materials 5211 to 5291 extending in the first direction may be a conductive material such as polysilicon.

In the region between the second and third doping regions 5312 and 5313, the same structures as the structures between the first and second doping regions 5311 and 5312 may be provided. For example, in the region between the second and third doping regions 5312 and 5313, the plurality of dielectric materials 5112 extending in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5212 to 5292 extending in the first direction may be provided.

In the region between the third and fourth doping regions 5313 and 5314, the same structures as between the first and second doping regions 5311 and 5312 may be provided. For example, in the region between the third and fourth doping regions 5313 and 5314, the plurality of dielectric materials 5112 extending in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5213 to 5293 extending in the first direction may be provided.

Drains 5320 may be respectively provided over the plurality of pillars 5113. The drains 5320 may be silicon materials doped with second type impurities. The drains 5320 may be silicon materials doped with n-type impurities. While it is assumed for the sake of convenience that the drains 5320 include n-type silicon, it is to be noted that the drains 5320 are not limited to being n-type silicon. For example, the width of each drain 5320 may be larger than the width of each corresponding pillar 5113. Each drain 5320 may be provided in the shape of a pad over the top surface of each corresponding pillar 5113.

Conductive materials 5331 to 5333 extending in the third direction may be provided over the drains 5320. The conductive materials 5331 to 5333 may be sequentially disposed in the first direction. The respective conductive materials 5331 to 5333 may be electrically coupled with the drains 5320 of corresponding regions. The drains 5320 and the conductive materials 5331 to 5333 extending in the third direction may be electrically coupled with through contact plugs. The conductive materials 5331 to 5333 extending in the third direction may be a metallic material. The conductive materials 5331 to 5333 extending in the third direction may be a conductive material such as polysilicon.

In FIGS. 5 and 6, the respective pillars 5113 may form strings together with the dielectric layer 5116 and the conductive materials 5211 to 5291, 5212 to 5292 and 5213 to 5293 extending in the first direction. The respective pillars 5113 may form NAND strings NS together with the dielectric layer 5116 and the conductive materials 5211 to 5291, 5212 to 5292 and 5213 to 5293 extending in the first direction. Each NAND string NS may include a plurality of transistor structures TS.

Figure 7:
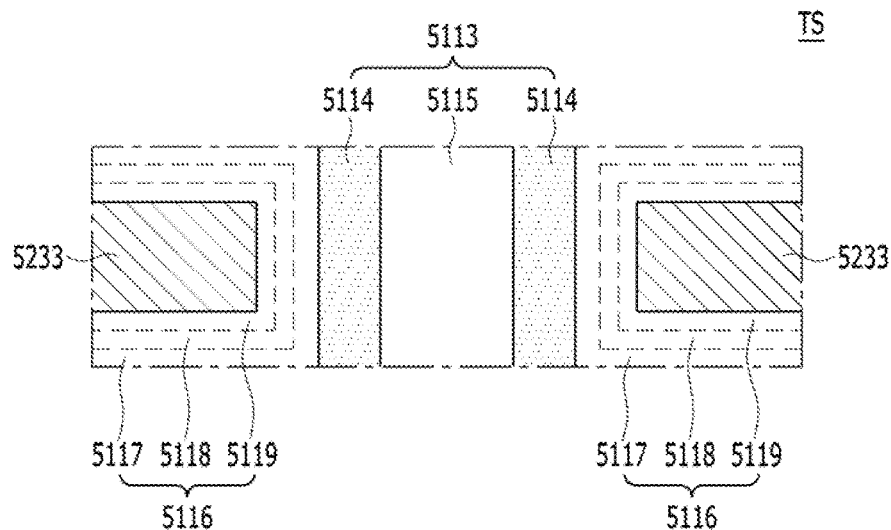

FIG. 7 is a cross-sectional view of the transistor structure TS of FIG. 6.

Referring to FIG. 7, in the transistor structure TS of FIG. 6, the dielectric layer 5116 may include first to third sub dielectric layers 5117, 5118 and 5119.

The surface layer 5114 of p-type silicon in each of the pillars 5113 may serve as a body. The first sub dielectric layer 5117 adjacent to the pillar 5113 may serve as a tunneling dielectric layer, and may include a thermal oxidation layer.

The second sub dielectric layer 5118 may serve as a charge storing layer. The second sub dielectric layer 5118 may serve as a charge capturing layer, and may include a nitride layer or a metal oxide layer such as an aluminum oxide layer, a hafnium oxide layer, or the like.

The third sub dielectric layer 5119 adjacent to the conductive material 5233 may serve as a blocking dielectric layer. The third sub dielectric layer 5119 adjacent to the conductive material 5233 which extends in the first direction may be formed as a single layer or multiple layers. The third sub dielectric layer 5119 may be a high-k dielectric layer such as an aluminum oxide layer, a hafnium oxide layer, or the like, which has a dielectric constant greater than the first and second sub dielectric layers 5117 and 5118.

The conductive material 5233 may serve as a gate or a control gate. That is, the gate or the control gate 5233, the blocking dielectric layer 5119, the charge storing layer 5118, the tunneling dielectric layer 5117 and the body 5114 may form a transistor or a memory cell transistor structure. For example, the first to third sub dielectric layers 5117 to 5119 may form an oxide-nitride-oxide (ONO) structure. In the embodiment, for the sake of convenience, the surface layer 5114 of p-type silicon in each of the pillars 5113 will be referred to as a body in the second direction.

The memory block BLKi may include the plurality of pillars 5113. Namely, the memory block BLKi may include the plurality of NAND strings NS. In detail, the memory block BLKi may include the plurality of NAND strings NS extending in the second direction or a direction perpendicular to the substrate 5111.

Each NAND string NS may include the plurality of transistor structures TS which are disposed in the second direction. At least one of the plurality of transistor structures TS of each NAND string NS may serve as a string source transistor SST. At least one of the plurality of transistor structures TS of each NAND string NS may serve as a ground select transistor GST.

The gates or control gates may correspond to the conductive materials 5211 to 5291, 5212 to 5292 and 5213 to 5293 extending in the first direction. In other words, the gates or the control gates may extend in the first direction and form word lines and at least two select lines, at least one source select line SSL and at least one ground select line GSL.

The conductive materials 5331 to 5333 extending in the third direction may be electrically coupled to one end of the NAND strings NS. The conductive materials 5331 to 5333 extending in the third direction may serve as bit lines BL. That is, in one memory block BLKi the plurality of NAND strings NS may be electrically coupled to one bit line BL.

The second type doping regions 5311 to 5314 extending in the first direction may be provided to the other ends of the NAND strings NS. The second type doping regions 5311 to 5314 extending in the first direction may serve as common source lines CSL.

Namely, the memory block BLKi may include a plurality of NAND strings NS extending in a direction perpendicular to the substrate 5111, e.g., the second direction, and may serve as a NAND flash memory block, for example, of a charge capturing type memory, in which a plurality of NAND strings NS are electrically coupled to one bit line BL.

While it is illustrated in FIGS. 5 to 7 that the conductive materials 5211 to 5291, 5212 to 5292 and 5213 to 5293 extending in the first direction are provided in 9 layers, it is to be noted that the conductive materials 5211 to 5291, 5212 to 5292 and 5213 to 5293 extending in the first direction are not limited to being provided in 9 layers. For example, conductive materials extending in the first direction may be provided in 8 layers, 16 layers or any multiple of to layers. In other words, in one NAND string NS, the number of transistors may be 8, 16 or more.

While it is illustrated in FIGS. 5 to 7 that 3 NAND strings NS are electrically coupled to one bit line BL, it is to be noted that the embodiment is not limited to having 3 NAND strings NS that are electrically coupled to one bit line BL. In the memory block BLKi, m number of NAND strings NS may be electrically coupled to one bit line BL, m being a positive integer. According to the number of NAND strings NS which are electrically coupled to one bit line BL, the number of conductive materials 5211 to 5291, 5212 to 5292 and 5213 to 5293 extending in the first direction and the number of common source lines 5311 to 5314 may be controlled as well.

Further, while it is illustrated in FIGS. 5 to 7 that 3 NAND strings NS are electrically coupled to one conductive material which extends in the first direction, it is to be noted that the embodiment is not limited to having 3 NAND strings NS electrically coupled to one conductive material which extends in the first direction. For example, n number of NAND strings NS may be electrically coupled to one conductive material which extends in the first direction, n being a positive integer. According to the number of NAND strings NS which are electrically coupled to one conductive material which extends in the first direction, the number of bit lines 5331 to 5333 may be controlled as well.

Figure 8:
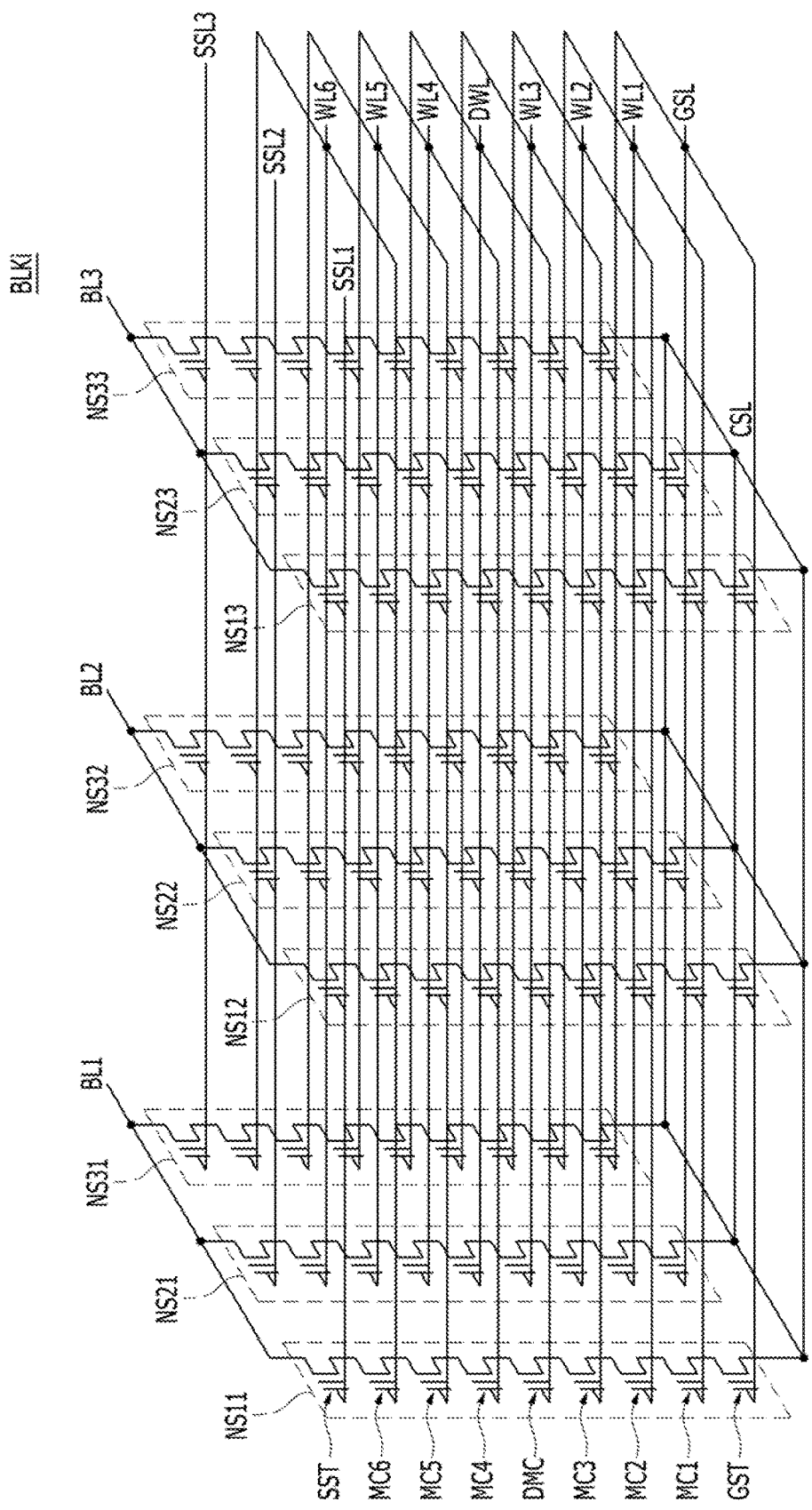

FIG. 8 is an equivalent circuit diagram illustrating the memory block BLKi having a first structure described with reference to FIGS. 5 to 7.

Referring to FIG. 8, in a block BLKi having the first structure, NAND strings NS11 to NS31 may be provided between a first bit line BL1 and a common source line CSL. The first bit line BL1 may correspond to the conductive material 5331 of FIGS. 5 and 6, which extends in the third direction. NAND strings NS12 to NS32 may be provided between a second bit line BL2 and the common source line CSL. The second bit line BL2 may correspond to the conductive material 5332 of FIGS. 5 and 6, which extends in the third direction. NAND strings NS13 to NS33 may be provided between a third bit line BL3 and the common source line CSL. The third bit line BL3 may correspond to the conductive material 5333 of FIGS. 5 and 6, which extends in the third direction.

A source select transistor SST of each NAND string NS may be electrically coupled to a corresponding bit line BL. A ground select transistor GST of each NAND string NS may be electrically coupled to the common source line CSL. Memory cells MC may be provided between the source select transistor SST and the ground select transistor GST of each NAND string NS.

In this example, NAND strings NS may be defined by units of rows and columns and NAND strings NS which are electrically coupled to one bit line may form one column. The NAND strings NS11 to NS31 which are electrically coupled to the first bit line BL1 may correspond to a first column, the NAND strings NS12 to NS32 which are electrically coupled to the second bit line BL2 may correspond to a second column, and the NAND strings NS13 to NS33 which are electrically coupled to the third bit line BL3 may correspond to a third column. NAND strings NS which are electrically coupled to one source select line SSL may form one row. The NAND strings NS11 to NS13 which are electrically coupled to a first source select line SSL1 may form a first row, the NAND strings NS21 to NS23 which are electrically coupled to a second source select line SSL2 may form a second row, and the NAND strings NS31 to NS33 which are electrically coupled to a third source select line SSL3 may form a third row.

In each NAND string NS, a height may be defined. In each NAND string NS, the height of a memory cell MC1 adjacent to the ground select transistor GST may have a value '1'. In each NAND string NS, the height of a memory cell may increase as the memory cell gets closer to the source select transistor SST when measured from the substrate 5111. In each NAND string NS, the height of a memory cell MC6 adjacent to the source select transistor SST may be 7.

The source select transistors SST of the NAND strings NS in the same row may share the source select line SSL. The source select transistors SST of the NAND strings NS in different rows may be respectively electrically coupled to the different source select lines SSL1, SSL2 and SSL3.

The memory cells at the same height in the NAND strings NS in the same row may share a word line WL. That is, at the same height, the word lines WL electrically coupled to the memory cells MC of the NAND strings NS in different rows may be electrically coupled. Dummy memory cells DMC at the same height in the NAND strings NS of the same row may share a dummy word line DWL. Namely, at the same height or level, the dummy word lines DWL electrically coupled to the dummy memory cells DMC of the NAND strings NS in different rows may be electrically coupled.

The word lines WL or the dummy word lines DWL located at the same level or height or layer may be electrically coupled with one another at layers where the conductive materials 5211 to 5291, 5212 to 5292 and 5213 to 5293 extending in the first direction may be provided. The conductive materials 5211 to 5291, 5212 to 5292 and 5213 to 5293 extending in the first direction may be electrically coupled in common to upper layers through contacts. At the upper layers, the conductive materials 5211 to 5291, 5212 to 5292 and 5213 to 5293 extending in the first direction may be electrically coupled. In other words, the ground select transistors GST of the NAND strings NS in the same row may share the ground select line GSL. Further, the ground select transistors GST of the NAND strings NS in different rows may share the ground select line GSL. That is, the NAND strings NS11 to NS13, NS21 to NS23 and NS31 to NS33 may be electrically coupled to the ground select line GSL.

The common source line CSL may be electrically coupled to the NAND strings NS. Over the active regions and over the substrate 5111, the first to fourth doping regions 5311 to 5314 may be electrically coupled. The first to fourth doping regions 5311 to 5314 may be electrically coupled to an upper layer through contacts and, at the upper layer, the first to fourth doping regions 5311 to 5314 may be electrically coupled.

Namely, as of FIG. 8, the word lines WL of the same height or level may be electrically coupled. Accordingly, when a word line WL at a specific height is selected, all NAND strings NS which are electrically coupled to the word line WL may be selected. The NAND strings NS in different rows may be electrically coupled to different source select lines SSL. Accordingly, among the NAND strings NS electrically coupled to the same word line WL, by selecting one of the source select lines SSL1 to SSL3, the NAND strings NS in the unselected rows may be electrically isolated from the bit lines BL1 to BL3. In other words, by selecting one of the source select lines SSL1 to SSL3, a row of NAND strings NS may be selected. Moreover, by selecting one of the bit lines BL1 to BL3, the NAND strings NS in the selected rows may be selected in units of columns.

In each NAND string NS, a dummy memory cell DMC may be provided. In FIG. 8, the dummy memory cell DMC may be provided between a third memory cell MC3 and a fourth memory cell MC4 in each NAND string NS. That is, first to third memory cells MC1 to MC3 may be provided between the dummy memory cell DMC and the ground select transistor GST. Fourth to sixth memory cells MC4 to MC6 may be provided between the dummy memory cell DMC and the source select transistor SST. The memory cells MC of each NAND string NS may be divided into memory cell groups by the dummy memory cell DMC. In the divided memory cell groups, memory cells, for example, MC1 to MC3, adjacent to the ground select transistor GST may be referred to as a lower memory cell group, and memory cells, for example, MC4 to MC6, adjacent to the string select transistor SST may be referred to as an upper memory cell group.

Hereinbelow, detailed descriptions will be made with reference to FIGS. 9 to 11, which show the memory device in the memory system in accordance with an embodiment implemented with a three-dimensional (3D) nonvolatile memory device different from the first structure.

Figure 9:
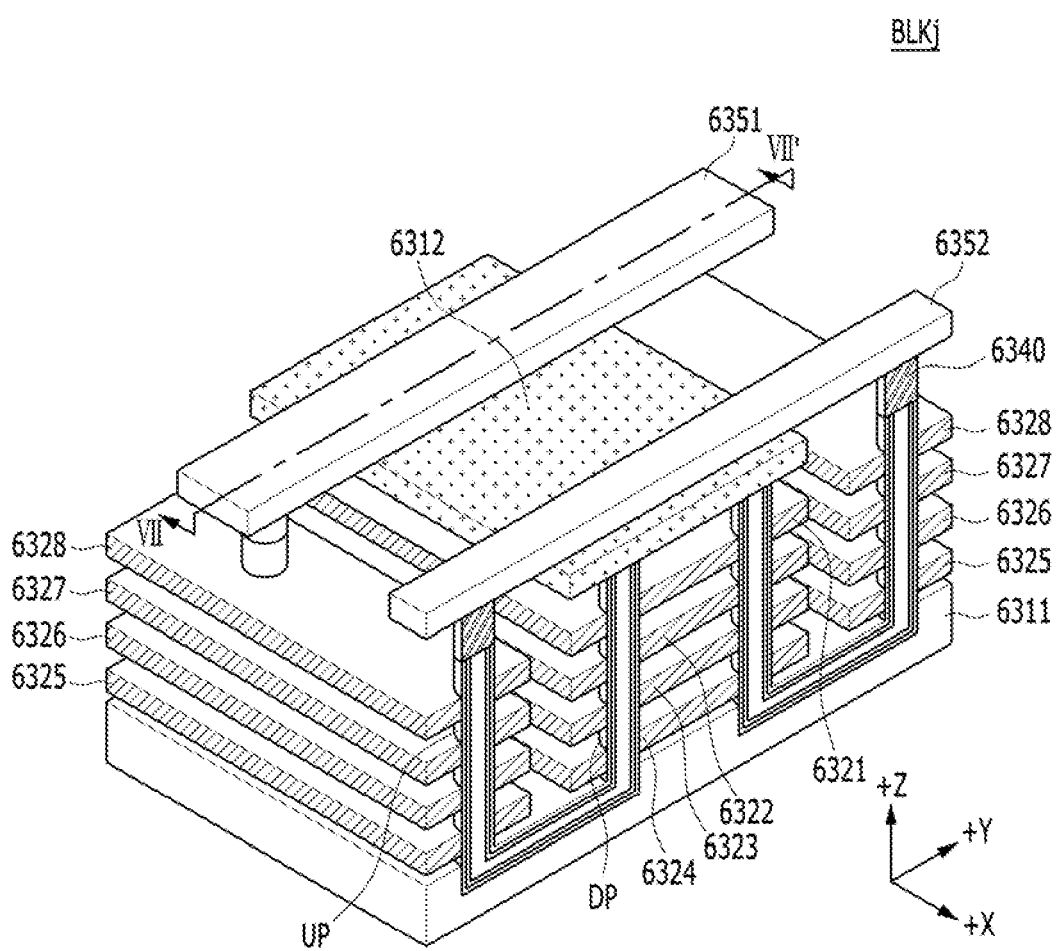

FIG. 9 is a perspective view schematically illustrating the memory device implemented with the three-dimensional (3D) nonvolatile memory device, which is different from the first structure described above with reference to FIGS. 5 to 8, and showing a memory block BLKj of the plurality of memory blocks of FIG. 4. FIG. 10 is a cross-sectional view illustrating the memory block BLKj taken along the line VII-VII' of FIG. 9.

Figure 10:
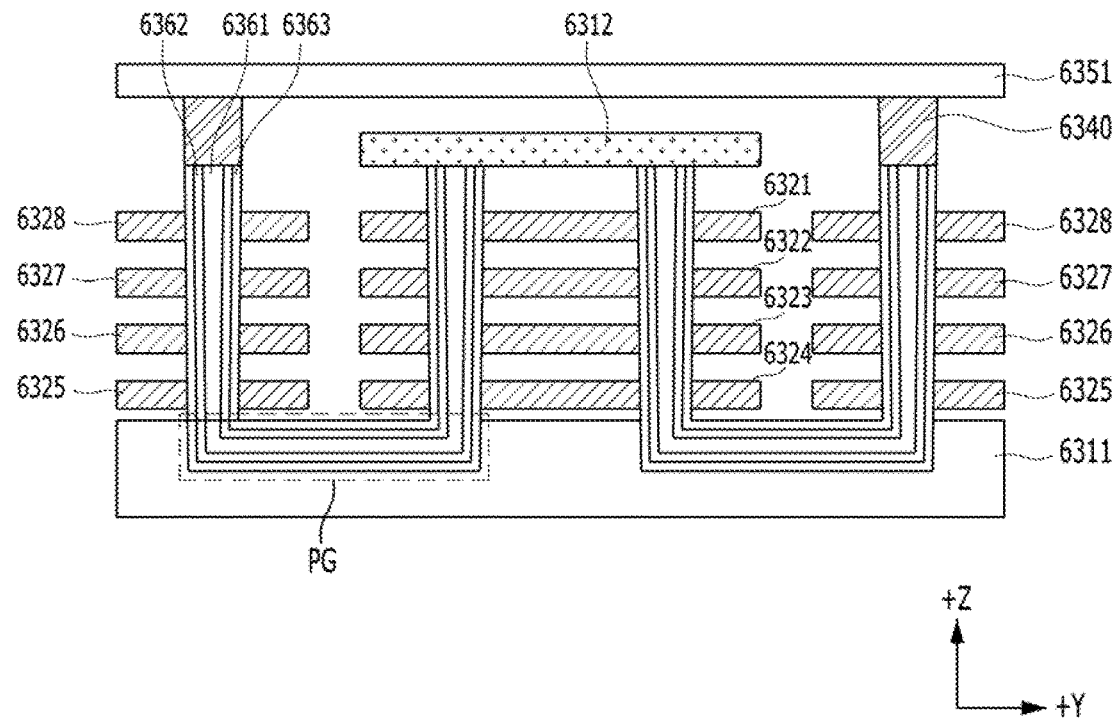

Referring to FIGS. 9 and 10, the memory block BLKj among the plurality of memory blocks of the memory device 150 of FIG. 1 may include structures extending in the first to third directions.

A substrate 6311 may be provided. For example, the substrate 6311 may include a silicon material doped with a first type impurity. For example, the substrate 6311 may include a silicon material doped with a p-type impurity or may be a p-type well, for example, a pocket p-well, and include an n-type well which surrounds the p-type well. While it is assumed in the embodiment for the sake of convenience that the substrate 6311 is p-type silicon, it is to be noted that the substrate 6311 is not limited to being p-type silicon.

First to fourth conductive materials 6321 to 6324 extending in the x-axis direction and the y-axis direction are provided over the substrate 6311. The first to fourth conductive materials 6321 to 6324 may be separated by a predetermined distance in the z-axis direction.

Fifth to eighth conductive materials 6325 to 6328 extending in the x-axis direction and the y-axis direction may be provided over the substrate 6311. The fifth to eighth conductive materials 6325 to 6328 may be separated by the predetermined distance in the z-axis direction. The fifth to eighth conductive materials 6325 to 6328 may be separated from the first to fourth conductive materials 6321 to 6324 in the y-axis direction.

A plurality of lower pillars DP which pass through the first to fourth conductive materials 6321 to 6324 may be provided. Each lower pillar DP extends in the z-axis direction. Also, a plurality of upper pillars UP which pass through the fifth to eighth conductive materials 6325 to 6328 may be provided. Each upper pillar UP extends in the z-axis direction.

Each of the lower pillars DP and the upper pillars UP may include an internal material 6361, an intermediate layer 6362, and a surface layer 6363. The intermediate layer 6362 may serve as a channel of the cell transistor. The surface layer 6363 may include a blocking dielectric layer, a charge storing layer and a tunneling dielectric layer.

The lower pillar DP and the upper pillar UP may be electrically coupled through a pipe gate PG. The pipe gate PG may be disposed in the substrate 6311. For instance, the pipe gate PG may include the same material as the lower pillar DP and the upper pillar UP.

A doping material 6312 of a second type which extends in the x-axis direction and the y-axis direction may be provided over the lower pillars DP. For example, the doping material 6312 of the second type may include an n-type silicon material. The doping material 6312 of the second type may serve as a common source line CSL.

Drains 6340 may be provided over the upper pillars UP. The drains 6340 may include an n-type silicon material. First and second upper conductive materials 6351 and 6352 extending in the y-axis direction may be provided over the drains 6340.

The first and second upper conductive materials 6351 and 6352 may be separated in the x-axis direction. The first and second upper conductive materials 6351 and 6352 may be formed of a metal. The first and second upper conductive materials 6351 and 6352 and the drains 6340 may be electrically coupled through contact plugs. The first and second upper conductive materials 6351 and 6352 respectively serve as first and second bit lines BL1 and BL2.

The first conductive material 6321 may serve as a source select line SSL, the second conductive material 6322 may serve as a first dummy word line DWL1, and the third and fourth conductive materials 6323 and 6324 serve as first and second main word lines MWL1 and MWL2, respectively. The fifth and sixth conductive materials 6325 and 6326 serve as third and fourth main word lines MWL3 and MWL4, respectively, the seventh conductive material 6327 may serve as a second dummy word line DWL2, and the eighth conductive material 6328 may serve as a drain select line DSL.

The lower pillar DP and the first to fourth conductive materials 6321 to 6324 adjacent to the lower pillar DP form a lower string. The upper pillar UP and the fifth to eighth conductive materials 6325 to 6328 adjacent to the upper pillar UP form an upper string. The lower string and the upper string may be electrically coupled through the pipe gate PG. One end of the lower string may be electrically coupled to the doping material 6312 of the second type which serves as the common source line CSL. One end of the upper string may be electrically coupled to a corresponding bit line through the drain 6340. One lower string and one upper string form one cell string which is electrically coupled between the doping material 6312 of the second type serving as the common source line CSL and a corresponding one of the upper conductive material layers 6351 and 6352 serving as the bit line BL.

That is, the lower string may include a source select transistor SST, the first dummy memory cell DMC1, and the first and second main memory cells MMC1 and MMC2. The upper string may include the third and fourth main memory cells MMC3 and MMC4, the second dummy memory cell DMC2, and a drain select transistor DST.

In FIGS. 9 and 10, the upper string and the lower string may form a NAND string NS, and the NAND string NS may include a plurality of transistor structures TS. Since the transistor structure included in the NAND string NS in FIGS. 9 and 10 is described above in detail with reference to FIG. 7, a detailed description thereof will be omitted herein.

Figure 11:
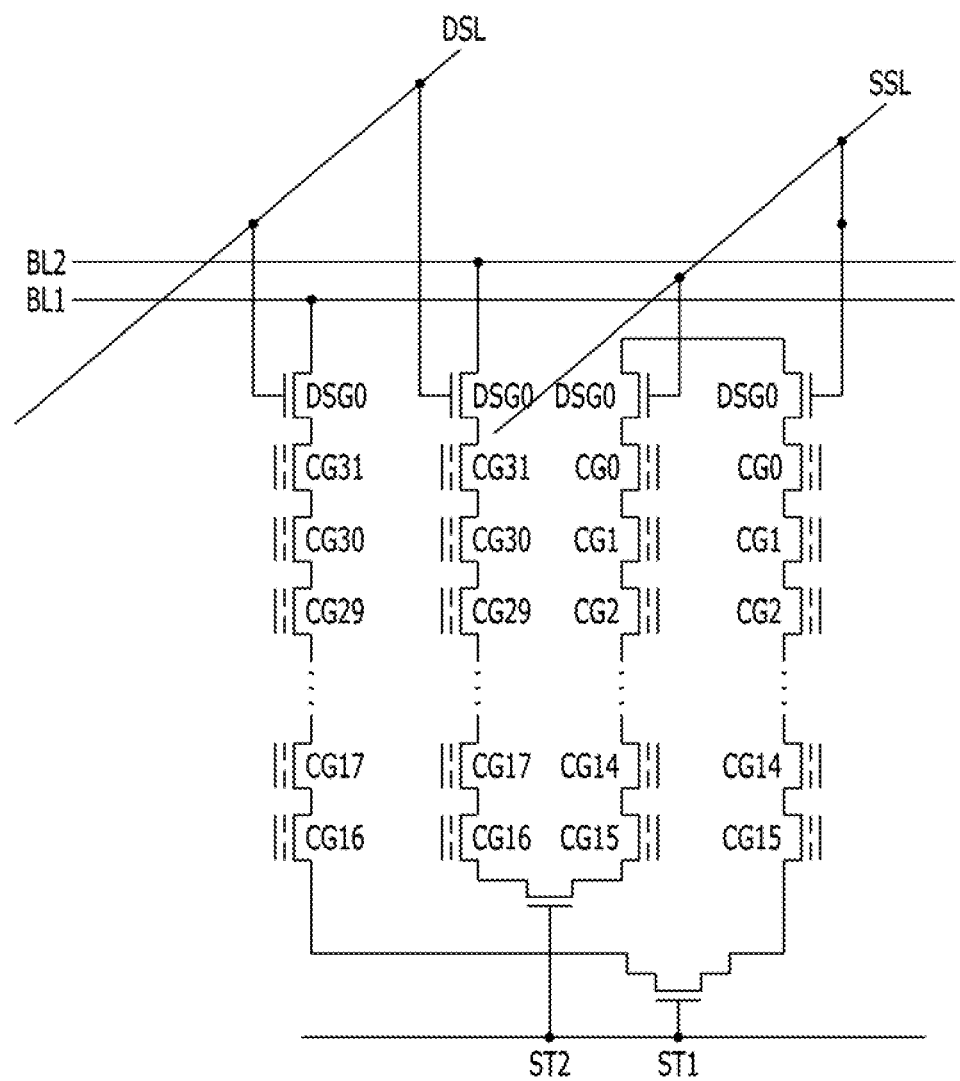

FIG. 11 is a circuit diagram illustrating the equivalent circuit of the memory block BLKj having the second structure as described above with reference to FIGS. 9 and 10. For the sake of convenience, only a first string and a second string, which form a pair in the memory block BLKj in the second structure are shown.

Referring to FIG. 11, in the memory block BLKj having the second structure among the plurality of blocks of the memory device 150, cell strings, each of which is implemented with one upper string and one lower string electrically coupled through the pipe gate PG as described above with reference to FIGS. 9 and 10, may be provided in such a way as to define a plurality of pairs.

Namely, in the certain memory block BLKj having the second structure, memory cells CG0 to CG31 stacked along a first channel CH1 (not shown), for example, at least one source select gate SSG1 and at least one drain select gate DSG1 may form a first string ST1, and memory cells CG0 to CG31 stacked along a second channel CH2 (not shown), for example, at least one source select gate SSG2 and at least one drain select gate DSG2 may form a second string ST2.

The first string ST1 and the second string ST2 may be electrically coupled to the same drain select line DSL and the same source select line SSL. The first string ST1 may be electrically coupled to a first bit line BL1, and the second string ST2 may be electrically coupled to a second bit line BL2.

While it is described in FIG. 11 that the first string ST1 and the second string ST2 are electrically coupled to the same drain select line DSL and the same source select line SSL, it may be envisaged that the first string ST1 and the second string ST2 may be electrically coupled to the same source select line SSL and the same bit line BL, the first string ST1 may be electrically coupled to a first drain select line DSL1 and the second string ST2 may be electrically coupled to a second drain select line DSL2. Further it may be envisaged that the first string ST1 and the second string ST2 may be electrically coupled to the same drain select line DSL and the same bit line BL, the first string ST1 may be electrically coupled to a first source select line SSL1 and the second string ST2 may be electrically coupled a second source select line SSL2.

Hereinafter, a data processing operation to a memory device in a memory system in accordance with an embodiment of the present invention, particularly, an operation corresponding to a command received from a host 102 will be described in detail with reference to FIGS. 12 and 13.

Figure 12:
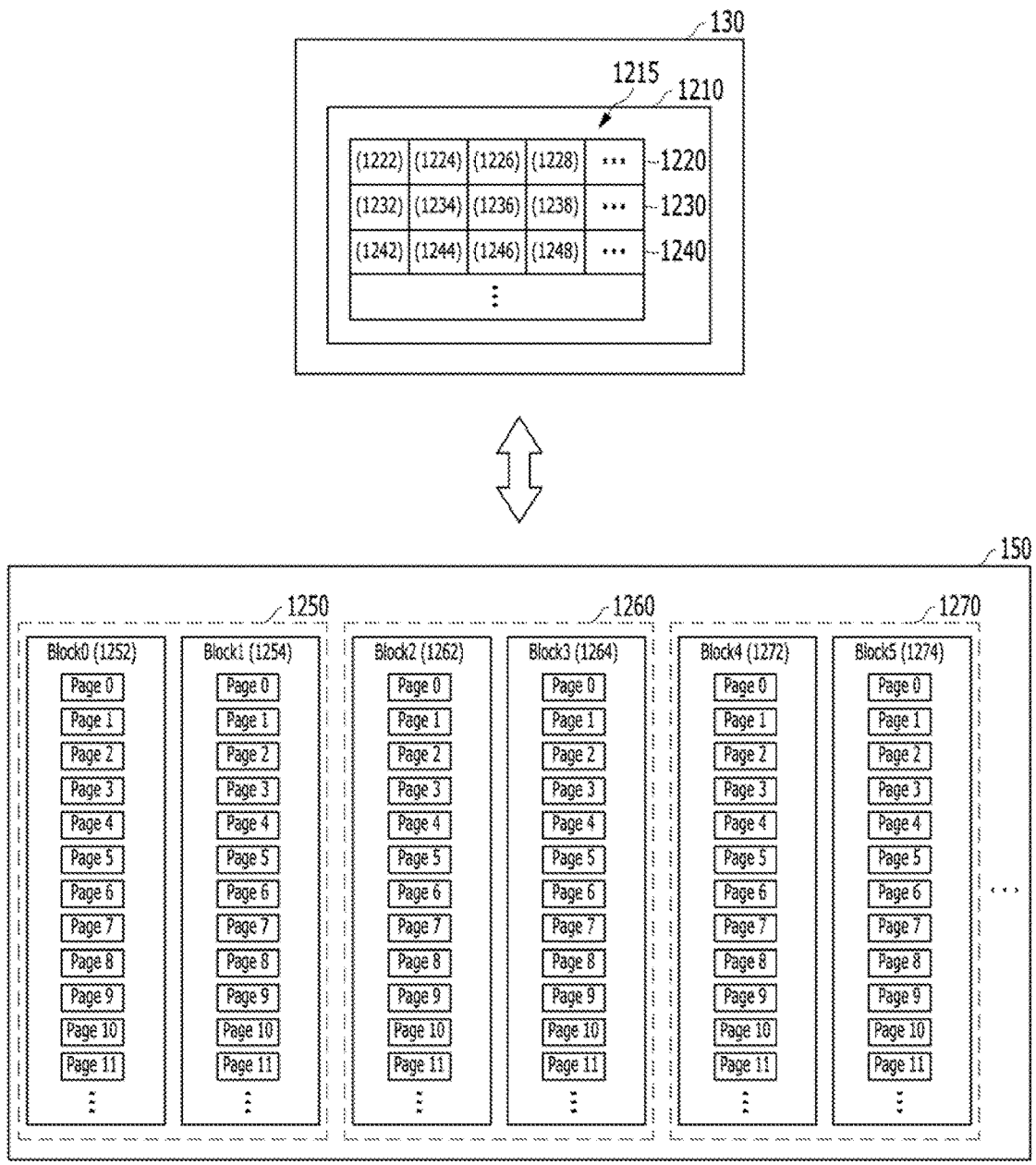
FIG. 12 is a diagram for describing a data processing operation to a memory device in a memory system, according to an embodiment of the present invention.

FIG. 12 is a diagram for describing a data processing operation to a memory device in a memory system, according to an embodiment of the present invention.

In the embodiment, for the sake of convenience in explanation, a description will be provided for an example in which the memory system 110 shown in FIG. 1 stores read data or write data corresponding to a command, e.g., a read command or a write command, received from the host 102, in a buffer/cache included in the memory 144 of the controller 130, and reads/writes the data stored in the buffer/cache on a plurality of memory blocks included in the memory device 150. Accordingly, the memory system 110 may perform an operation corresponding to a command received from the host 102. (Hereinafter, "an operation corresponding to a command received from the host" is referred to as a "command operation.") For example, the memory system 110 may perform a data read operation corresponding to a read command. The memory system 110 may perform a data program operation corresponding to a write command.

In the embodiment, for the sake of convenience in explanation, a data processing operation in the memory system 110 will be described as being performed by the controller 130. For example, the processor 134 included in the controller 130 may perform a data processing operation, for example, through an FTL. In addition, in the embodiment, the controller 130 may store user data and meta data corresponding to a write command received from the host 102, in the buffer included in the memory 144 of the controller 130, and then may program the data stored in the buffer, on an arbitrary memory block among the plurality of memory blocks included in the memory device 150, in other words, perform a program operation. Further, the controller 130 may read user data and meta data corresponding to a read command received from the host 102, from a plurality of pages included in a corresponding memory block of the memory device 150, may store the user data and meta data in the buffer included in the memory 144 of the controller 130, and then may provide the data stored in the buffer to the host 102, in other words, performs a read operation.

In the embodiment, a description will be provided for a data processing operation in the memory system in the case where a power state is changed while the memory system 110 in a power-on state performs a command operation corresponding to a command received from the host 102. In particular, a description will be provided for a data processing operation in the case where sudden power off occurs while the memory system 110 in a power-on state performs a program operation corresponding to a write command received from the host 102, on a plurality of memory blocks included in the memory device 150. In other words, a description will be provided for a data processing operation in the case where, while the memory system 110 performs a program operation in a power-on state, a state of the memory system 110 is changed to a power-off state due to sudden power off, and thereafter the state is changed from the power-off state to the power-on state.

In this regard, in the embodiment, a more detailed description will be provided for processing, before sudden power off occurs, write data that is being programmed on an arbitrary page of an arbitrary memory block, in the case where the sudden power off occurs in the memory system 110 while the memory system 110 in the power-on state performs a program operation corresponding to the write command received from the host 102, in particular, programs the write data corresponding to the write command on the arbitrary page of the arbitrary memory block among the plurality of memory blocks included in the memory device 150.

For example, in an embodiment, in the case where sudden power off occurs while the memory system 110 in the power-on state performs a program operation corresponding to a write command received from the host 102, on a plurality of pages included in an arbitrary memory block of the memory device 150, the memory system 110 may perform a recovery operation using a list updated in the power-on state, after the sudden power off. Particularly, in the case where sudden power off occurs while the memory system 110 is programming write data, at a second time, on second pages among a plurality of pages included in an arbitrary memory block, after an arbitrary first time when the memory system 110 in the power-on state programs and stores write data corresponding to a write command on first pages among a plurality of pages included in an arbitrary memory block, and updates a list corresponding to a program at the first time, the memory system 110 may check programs at the first time and the second time using the updated list after the memory system 110 enters the power-on state at a third time following the second time. That is, the memory system 110 may check a first page of a memory block on which a last program has been completed in the memory device 150 and a second page on which a program has not been completed, and then may perform a recovery operation.

Hereinbelow, a data processing operation in the memory system according to an embodiment, for example, a data processing operation in the case where sudden power off occurs while the memory system in the power-on state programs data on the memory device, will be described in more detail with reference to FIG. 12.

First, referring to FIG. 12, the controller 130 may write and store data corresponding to a command received from the host 102. For example, the controller 130 may store user data corresponding to the write command, in super memory blocks of the memory device 150, for example, in open blocks 1252, 1254, 1262, 1264, 1272 and 1274 of a first super memory block 1250, a second super memory block 1260 and a third super memory block 1270. A super memory block is a block comprising at least first and second memory blocks. Furthermore, for a write operation of user data, the controller 130 may write and store map data for the user data in the open blocks 1252, 1254, 1262, 1264, 1272 and 1274 of the first super memory block 1250, the second super memory block 1260 and the third super memory block 1270 of the memory device 150.

In an embodiment, the memory device 150 may include a plurality of memory dies, each of the memory dies may include a plurality of planes, and each of the planes may include a plurality of memory blocks. So for example, as illustrated in the embodiment of FIG. 12 each of the super memory blocks, that is, each of the first super memory block 1250, the second memory block 1260 and the third super memory block 1270, may include two memory blocks included in the plurality of planes and the plurality of memory dies of the memory device 150, for example, a first memory block and a second memory block. In the embodiment of FIG. 12, for the sake of convenience in explanation, an example is provided, wherein each of the first to third super memory blocks 1250, 1260 and 1270 of the memory device 150 includes only two memory blocks, that is, a first memory block and a second memory block. However, it is understood, that each of the first to third super memory blocks 1250, 1260 and 1270 of the memory device 150 may include a larger number of memory blocks in addition to the first and second memory blocks.

Referring, to the embodiment of FIG. 12, the first super memory block 1250 includes a block 1252 as the first memory block, and a block 1254 as the second memory block. The second super memory block 1260 includes a block 1262 as the first memory block, and a block 1264 as the second memory block. The third super memory block 1260 includes a block 1272 as the first memory block, and a block 1274 as the second memory block. Furthermore, in the case where the first memory blocks 1252, 1262 and 1272, which are respectively included in the first super memory block 1250, the second super memory block 1260 and the third super memory block 1270, are arbitrary memory blocks included in a first plane of a first memory die of the memory dies of the memory device 150, the second memory blocks 1254, 1264 and 1274, which are respectively included in the first super memory block 1250, the second super memory block 1260 and the third super memory block 1270, may be another memory blocks different from the arbitrary memory blocks, included in the first plane of the first memory die of the memory dies of the memory device 150, may be arbitrary memory blocks included in a second plane of the first memory die, or may be arbitrary memory blocks included in planes of a second memory die of the memory device 150.

That is, the first memory blocks 1252, 1262 and 1272 and the second memory blocks 1254, 1264 and 1274 of the first super memory block 1250, the second super memory block 1260 and the third super memory block 1270 may be memory blocks included in an identical plane of an identical memory die, memory blocks included in different planes of an identical memory die, or memory blocks included in different memory dies. Hereinafter, for the sake of convenience in explanation, a description will be provided for the case where the first memory blocks 1252, 1262 and 1272 are included in the first plane of the first memory die of the memory dies of the memory device 150, and the second memory blocks 1254, 1264 and 1274 are included in the second plane of the first memory die of the memory device 150.

The controller 130 may write and store, through a one-shot program, user data and meta data of a command operation corresponding to a command received from the host 102, in the super memory blocks. Hence, referring to the embodiment of FIG. 12, the controller 130 may write and store, through a one-shot program, user data and meta data of a command operation corresponding to a command received from the host 102, in the first super memory block 1250, the second super memory block 1260 and the third super memory block 1270 each of which includes the first/second memory blocks 1252/1254, 1262/1264, and 1272/1274, respectively.

The controller 130 may perform the command operation corresponding to the command received from the host 102, generate and update a list 1215 including information indicating that the user data is stored in pages of the first memory blocks and the second memory blocks included in the first to third super memory blocks 1250, 1260 and 1270 of the memory device 150, and stores the list 1215 in a buffer 1210. The buffer 1210 may be included in the memory 144 of the controller 130.

The first to third super memory blocks 1250, 1260 and 1270 may be included in the memory device 150. In the case where data is programmed to a plurality of pages included in the first to third super memory blocks 1250, 1260 and 1270, through a one-shot program, the controller 130 may record and store, in the list 1215, information indicating corresponding pages of the first to third super memory blocks 1250, 1260 and 1270 in which data is stored, in other words, information indicating that a program has been normally completed in the plurality of pages included in the first to third super memory blocks 1250, 1260 and 1270.

Program information on the plurality of pages included in the first to third super memory blocks 1250, 1260 and 1270 may be recorded in the list 1215 in the form of a bit map. Rows 1220, 1230 and 1240 in the list 1215 respectively may correspond to the first to third super memory blocks 1250, 1260 and 1270. Program information on the plurality of pages included in the first to third super memory blocks 1250, 1260 and 1270 may be stored in bit regions of the respective rows 1220, 1230 and 1240.

For example in more detail, in a state in which the memory system 110 is powered on, when the controller 130 programs and stores, through a one-shot program, data in first and second pages "page 0" and "page 1" of the first memory block 1252 and the second memory block 1254 of the first super memory block 1250, at an arbitrary time t0, program start information and program end information may be recorded in a first bit region 1222 of the first row 1220 in the list 1215, corresponding to the first super memory block 1250. At a time t1 following the time t0, in the case where data is programmed and stored, through a one-shot program, in first and second pages "page 0" and "page 1" of the first memory block 1262 and the second memory block 1264 of the second super memory block 1260, program start information and program end information may be recorded in a first bit region 1232 of the second row 1230 in the list 1215, corresponding to the second super memory block 1260. Furthermore, at a time t2 following the time t1, in the case where data is programmed and stored, through a one-shot program, in first and second pages "page 0" and "page 1" of the first memory block 1272 and the second memory block 1274 of the third super memory block 1270, program start information and program end information may be recorded in a first bit region 1242 of the third row 1240 in the list 1215, corresponding to the third super memory block 1270.

At a time t3 following the time t2, in the case where data is programmed and stored, through a one-shot program, in third and fourth pages "page 2" and "page 3" of the first memory block 1252 and the second memory block 1254 of the first super memory block 1250, program start information and program end information may be recorded in a second bit region 1224 of the first row 1220 in the list 1215, corresponding to the first super memory block 1250. At a time t4 following the time t3, in the case where data is programmed and stored, through a one shot program, in third and fourth pages "page 2" and "page 3" of the first memory block 1262 and the second memory block 1264 of the second super memory block 1260, program start information and program end information may be recorded in a second bit region 1234 of the second row 1230 in the list 1215, corresponding to the second super memory block 1260. Furthermore, at a time t5 following the time t4, in the case where data is programmed and stored, through a one-shot program, in third and fourth pages "page 2" and "page 3" of the first memory block 1272 and the second memory block 1274 of the third super memory block 1270, program start information and program end information may be recorded in a second bit region 1244 of the third row 1240 in the list 1215, corresponding to the third super memory block 1270.

In this way, program information may be recorded in the list 1215 stored in the buffer 1210 of the controller 130, in other words, program start information and program end information may be recorded in bit regions of the respective rows 1220, 1230 and 1240 corresponding to the first to third super memory blocks 1250, 1260 and 1270, in the form of a bit map. For example, in the third row 1240 of the list 1215, if the program information is recorded as (0, 0) in the first bit region 1242, it indicates that a one-shot program did not start for the first and second pages "page 0" and "page 1" of the third super memory block 1270, at the time t2, while the memory system 110 was in the power-on state. For example, in the third row 1240 of the list 1215, if the program information is recorded as (0, 1) in the first bit region 1242, it indicates that, at the time t2, the one-shot program was started for the first and second pages "page 0" and "page 1" of the third super memory block 1270 but it was not completed normally. For example, in the third row 1240 of the list 1215, if the program information is recorded as (1, 1) in the first bit region 1242, it indicates that, at the time t2, the one-shot program started for the first and second pages "page 0" and "page 1" of the third super memory block 1270 and it was completed normally.

That is, the controller 130 may perform, when the memory system 110 is in the power-on state, a program operation corresponding to a write command received from the host 102, in to particular, stores data in a plurality of pages included in the super memory blocks 1250, 1260 and 170 of the memory device 150, through the one-shot program. At the same time, the controller 130 may update and record program start information and program end information for the pages of the first to third super memory blocks 1250, 1260 and 1270 in the list 1215 in the form of a bit map, that is, in bit regions of the corresponding respective rows 1220, 1230 and 1240 of the list 1215.

For instance, in a state in which the memory system 110 is powered on, if data is stored at the time t1 in the first and second pages "page 0" and "page 1" of the second super memory block 1260 through the one-shot program, the controller 130 may update the list 1215 by recording the program start information and the program end information as (1, 1) in the first bit region 1232 of the second row 1230 of the list 1215, which notifies that the one-shot program has been normally completed after the one-shot program has started for the first and second pages "page 0" and "page 1" of the second super memory block 1260, at the time t1. At the time t2 following the time t1, if sudden power off occurs while the controller 130 performs the one-shot program for the first and second pages "page 0" and "page 1" of the third super memory block 1270, the memory system 110 may be changed from the power-on state to the power-off state. At this time, in the list 1215, (0, 1) may be recorded as the program start information and the program end information in the first bit region 1242 of the third row 1240 corresponding to the first and second pages "page 0" and "page 1" of the third super memory block 1270. That is, at the time t2 following the time t1, if the one-shot program starts to be performed, the controller 130 may normally record the program start information in the first bit region 1242 of the third row 1240 of the list 1215. When the memory system 110 enters a power-off state due to sudden power off while the one-shot program is performed, the controller 130 may not normally record the program end information in the first bit region 1242 of the third row 1240 of the list 1215, which notifies that the one-shot program has not been normally completed.

Thereafter, at the time t3 following the time t2, when the memory system 110 is changed from the power-off state to the power-on state, the controller 130 may check the program start information and the program end information recorded in the list 1215, in particular, may check the program start information and the program end information recorded in the first bit region 1232 of the second row 1230 and the program start information and the program end information recorded in the first bit region 1242 of the third row 1240, and thus may check that, at the time t2 at which the sudden power off has occurred, the one-shot program has been normally performed and completed for the first and second pages "page 0" and "page 1" of the second super memory block 1260, and the one-shot program has not been normally performed for the first and second pages "page 0" and "page 1" of the third super memory block 1270. Accordingly, the controller 130 may perform a recovery operation for the first and second pages "page 0" and "page 1" of the third super memory block 1270 for which the one-shot program has not been normally performed.

Therefore, in the memory system according to an embodiment, program information on memory blocks of the memory device 150 may be recorded in the list 1215 before sudden power off, and, when the sudden power off occurs while a program operation is performed, in particular, through the one-shot program, the controller 130 may check the program information recorded in the list 1215, to thereby precisely check pages of a memory block for which a program operation was interrupted after it had started due to the sudden power off. Therefore, a recovery operation required due to the sudden power off in the memory system can be more effectively performed for only those memory pages which were affected by the sudden power off. Hereinafter, an operation of processing data in the memory system in accordance with an embodiment will be described in detail with reference to FIG. 13.

Figure 13:
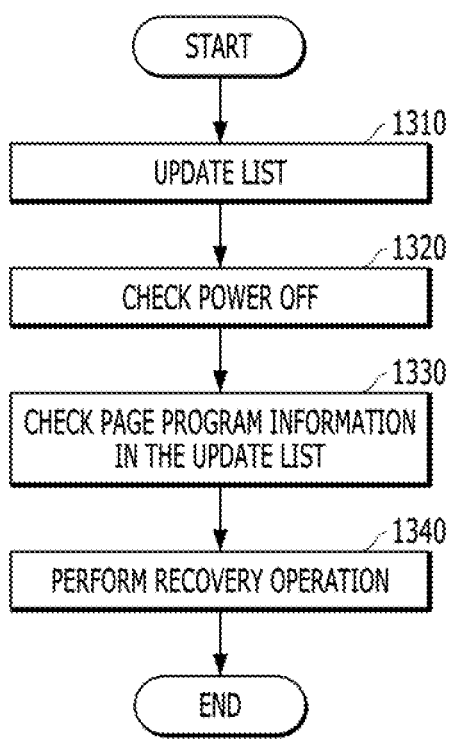
FIG. 13 is a flow chart illustrating a data processing operation in a memory system, according to an embodiment of the present invention.

FIG. 13 is a flow chart illustrating a data processing operation in a memory system, according to an embodiment of the present invention.

Referring to FIG. 13, at step 1310, the memory system in a power-on state may perform a program operation corresponding to a command, e.g., a write command, received from a host, on a plurality of memory blocks included a memory device, in particular, may store data in pages included in super memory blocks of the memory device through a one-shot program, and may update program information corresponding to the one-shot program on a list, in other words, may record program start information and program end information in the list in the form of a bit map.

At step 1320, while the memory system in the power-on state performs the program operation, if sudden power off occurs in the memory system, sudden power off of the memory system may be checked, that is, it is checked that the memory system is changed to a power-off state.

Thereafter, at step 1330, when the memory system is changed from the power-off state to the power-on state, the controller will check the program status of the pages based on program information in the updated list. Specifically, the controller will check for the program start information (0 or 1) and the program end information (0 or 1) recorded in the updated list. Thus, in the super memory blocks of the memory device, pages for which the program has been normally completed and pages for which the program has not been normally completed after the program has started may be checked.

At step 1340, a recovery operation is performed for the pages for which the program has not normally completed in the super memory blocks of the memory device due to a sudden power off.

In this regard, descriptions have been provided, with reference to FIG. 12, for the operation of performing, while the memory system is in the power-on state, a program operation corresponding to a command, e.g., a write command, received from the host, in particular, performing a one-shot program for pages included in a super memory block of the memory device, and updating a list corresponding to the one-shot program, in other word, recording program information in the list, and the operation of checking, when sudden power off occurs in the memory system while the program operation is performed, program pages in the super memory block of the memory device and recovering the corresponding pages. Therefore, the detailed description related to these will be omitted.

As described above, the memory system and the operating method thereof in accordance with embodiments of the present invention may minimize the complexity and performance deterioration the memory system, thereby more rapidly and efficiently processing data to the memory device. According to an embodiment of the present invention, a memory system and an operation method thereof are provided capable for performing an improved more efficient recovery operation during a power on following a sudden power off of the memory system.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
a memory device comprising a plurality of memory dies, each memory die including a plurality of planes, each plane including a plurality of memory blocks, each memory block including a plurality of pages, each page including a plurality of memory cells in which data is stored; and
a controller suitable for, after a first time when the memory system in a power-on state performs a program operation corresponding to a write command received from a host, on first pages of the memory blocks, and records program information on the program operation in a list stored in a memory of the controller, in the case where power off occurs at a second time while the memory system performs a program operation on second pages of the memory blocks, checking the program information recorded in the list after the memory system is changed from a power-off state to the power-on state at a third time, and performing a recovery operation for the memory blocks based on the list for which a program operation was not completed due do the power off.

2. The memory system of claim 1, wherein the list includes rows corresponding to the respective memory blocks, and bit regions in the rows, corresponding to the respective pages of the memory blocks.

3. The memory system of claim 2, wherein the controller records program information on the first pages in a first bit region corresponding to the first pages, in a first row of the list corresponding to a first memory block.

4. The memory system of claim 3, wherein the controller records program start information and program end information on the first pages in the list in the form of a bit map.

5. The memory system of claim 1, wherein the controller stores data corresponding to the write command in pages of a super memory block including the memory blocks, through a one-shot program.

6. The memory system of claim 5,
wherein the super memory block includes a first memory block and a second memory block of the memory blocks, and
wherein the first memory block is an arbitrary memory block among memory blocks included in a first plane of a first memory die among the memory dies.

7. The memory system of claim 6, wherein the second memory block is a memory block different from the arbitrary memory block among the memory blocks included in the first plane of the first memory die among the memory dies.

8. The memory system of claim 6, wherein the second memory block is an arbitrary memory block among memory blocks included in a second plane of the first memory die among the memory dies.

9. The memory system of claim 6, wherein the second memory block is an arbitrary memory block among memory blocks included in a plurality of planes of a second memory die among the memory dies.

10. The memory system of claim 6, wherein the list includes a row corresponding to the super memory block, and bit regions in the row, corresponding to respective pages of the super memory block.

11. An operating method of a memory system, the operating method comprising:
performing, in a plurality of pages which are respectively included in a plurality of memory blocks of a memory device and include a plurality of memory cells, a program operation corresponding to a write command received from a host, on first pages of the memory blocks, at a first time when the memory system is in a power-on state;
recording program information on the program operation in a list stored in a memory of a controller;
changing a state of the memory system from the power-on state to a power-off state, at a second time when power off occurs while performing a program operation on second pages of the memory blocks; and
checking the program information recorded in the list after the memory system is changed from the power-off state to the power-on state at a third time, and performing a recovery operation for the memory blocks based on the list for which a program operation was not completed due do the power off.

12. The operating method of claim 11, wherein the list includes rows corresponding to the respective memory blocks, and bit regions in the rows, corresponding to the respective pages of the memory blocks.

13. The operating method of claim 12, wherein the recording of the program information on the program operation comprises:

recording program information on the first pages in a first bit region corresponding to the first pages, in a first row of the list corresponding to a first memory block.

14. The operating method of claim 13, wherein the recording of the program information on the first pages in the first bit region comprises:

recording program start information and program end information on the first pages in the list in the form of a bit map.

15. The operating method of claim 11, wherein the performing of the program operation comprises:

storing data corresponding to the write command in pages of a super memory block including the memory blocks, through a one-shot program.

16. The operating method of claim 15, wherein the super memory block includes a first memory block and a second memory block of the memory blocks, and wherein the first memory block is an arbitrary memory block among memory blocks included in a first plane of a first memory die among the memory dies.

17. The operating method of claim 16, wherein the second memory block is a memory block different from the arbitrary memory block among the memory blocks included in the first plane of the first memory die among the memory dies.

18. The operating method of claim 16, wherein the second memory block is an arbitrary memory block among memory blocks included in a second plane of the first memory die among the memory dies.

19. The operating method of claim 16, wherein the second memory block is an arbitrary memory block among memory blocks included in a plurality of planes of a second memory die among the memory dies.

20. The operating method of claim 16, wherein the list includes a row corresponding to the super memory block, and bit regions in the row, corresponding to respective pages of the super memory block.

* * * * *